(12) United States Patent
Lee et al.

(10) Patent No.: US 8,895,973 B2
(45) Date of Patent: Nov. 25, 2014

(54) ORGANIC LIGHT EMITTING DIODE DISPLAY THAT INCLUDES LAYER FOR REDUCING OXIDATION OF COMMON ELECTRODE

(71) Applicants: Young-Sahn Lee, Yongin (KR); Young-Mi Cho, Yongin (KR); Kyung-Chan Chae, Yongin (KR)

(72) Inventors: Young-Sahn Lee, Yongin (KR); Young-Mi Cho, Yongin (KR); Kyung-Chan Chae, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 13/804,900

(22) Filed: Mar. 14, 2013

(65) Prior Publication Data
    US 2014/0042403 A1    Feb. 13, 2014

(30) Foreign Application Priority Data
    Aug. 10, 2012 (KR) .................. 10-2012-0087896

(51) Int. Cl.
    *H01L 51/52*    (2006.01)
    *H01L 51/44*    (2006.01)
    *H01L 27/32*    (2006.01)

(52) U.S. Cl.
    CPC ....... *H01L 51/448* (2013.01); *H01L 2251/5315* (2013.01); *H01L 27/3244* (2013.01); *H01L 51/5256* (2013.01); *H01L 51/5253* (2013.01); *H01L 27/3223* (2013.01); *H01L 51/5234* (2013.01)
    USPC ............................................. 257/40; 257/100

(58) Field of Classification Search
    CPC ................................................... H01L 51/5259
    See application file for complete search history.

(56) References Cited

U.S. PATENT DOCUMENTS

2003/0152801 A1    8/2003    Liao et al.
2012/0007107 A1*   1/2012    Choi ............................. 257/88

FOREIGN PATENT DOCUMENTS

| JP | 08-264278 A | 10/1996 |
| KR | 10-2000-0048342 A | 7/2000 |
| KR | 10-2010-0067218 A | 6/2010 |

* cited by examiner

*Primary Examiner* — Stephen W Smoot
(74) *Attorney, Agent, or Firm* — Lee Morse, P.C.

(57) ABSTRACT

An organic light emitting diode display according to an exemplary embodiment includes a substrate, a pixel electrode on the substrate, an organic emission layer on the pixel electrode, a common electrode on the organic emission layer, a cover layer on the common electrode, an oxidation reducing layer on the cover layer, and a thin film encapsulation layer covering the oxidation reducing layer, the oxidation reducing layer being configured to reduce oxidation of the common electrode, the oxidation reducing layer being separated from the common electrode. The oxidation reducing layer may include at least one of a dummy common electrode, an ultraviolet ray (UV) blocking layer, and a buffer layer.

20 Claims, 3 Drawing Sheets

ORGANIC LIGHT EMITTING DIODE DISPLAY THAT INCLUDES LAYER FOR REDUCING OXIDATION OF COMMON ELECTRODE

CROSS-REFERENCE TO RELATED APPLICATIONS

This application claims priority under 35 U.S.C. §119 to and the benefit of Korean Patent Application No. 10-2012-0087896 filed in the Korean Intellectual Property Office on Aug. 10, 2012, the entire contents of which are incorporated herein by reference.

BACKGROUND

1. Field

The described technology relates generally to an organic light emitting diode display, and more particularly, to an organic light emitting diode display having a thin film encapsulation layer.

2. Description of the Related Art

An organic light emitting diode display includes organic light emitting elements constituted by an anode that is a hole injection electrode, an organic emission layer, and a cathode that is an electron injection electrode. Each organic light emitting element emits light by energy generated when an exciton generated by combining electrons and holes in the organic emission layer falls from an excited state to a bottom state, and the organic light emitting diode display displays a predetermined image by using this light emission.

Since the organic light emitting diode display has a self-luminance characteristic and a separate light source is not required unlike a liquid crystal display, a thickness and a weight thereof may be reduced. Further, since the organic light emitting diode display exhibits high quality characteristics such as low power consumption, high luminance, and rapid response speed, the organic light emitting diode display receives attention as a next generation display device.

The organic light emitting element may be deteriorated by external factors such as external moisture, oxygen, or ultraviolet rays (UV). Particularly, since external oxygen and moisture significantly affect a life-span of the organic light emitting element, a packaging technology encapsulation the organic light emitting element is very important.

The above information disclosed in this Background section is only for enhancement of understanding of the background of the described technology and therefore it may contain information that does not form the prior art that is already known in this country to a person of ordinary skill in the art.

SUMMARY

One or more exemplary embodiments provides an organic light emitting diode display that may include a substrate, a pixel electrode on the substrate, an organic emission layer on the pixel electrode, a common electrode on the organic emission layer, a cover layer formed on the common electrode, a dummy common electrode on the cover layer, and a thin film encapsulation layer covering the dummy common electrode, wherein the dummy common electrode may be separated from the common electrode.

The dummy common electrode may have a thickness of 50 Å to 200 Å.

The dummy common electrode may include any one selected from magnesium (Mg), silver (Ag), lithium (Li), sodium (Na), calcium (Ca), or strontium (Sr), or an alloy thereof.

An ultraviolet ray (UV) blocking layer may be between the dummy common electrode and the thin film encapsulation layer.

A buffer layer may be between the ultraviolet ray (UV) blocking layer and the thin film encapsulation layer.

The buffer layer may be any one selected from lithium fluoride (LiF), calcium fluoride ($CaF_2$), silicon oxide (SiO), titanium oxide (TiOx), molybdenum oxide (MoOx), zinc oxide (ZnO), zinc tin oxide (ZnSnOx), and aluminum oxynitride (AlOxNy).

The thin film encapsulation layer may include at least one encapsulation organic layer and at least one encapsulation inorganic layer alternately laminated.

At least one of the dummy common electrode and the ultraviolet ray (UV) blocking layer may be configured to reduce oxidation of the common electrode.

The dummy common electrode may include a material that is configured to react with oxygen to form a transparent oxide.

One or more exemplary embodiments provides an organic light emitting diode display that may include a substrate, a pixel electrode on the substrate, an organic emission layer on the pixel electrode, a common electrode on the organic emission layer, a cover layer on the common electrode, an oxidation reducing layer on the cover layer, the oxidation reducing layer being configured to reduce oxidation of the common electrode, and a thin film encapsulation layer covering the oxidation reducing layer, wherein the oxidation reducing layer may be separated from the common electrode.

The oxidation reducing layer may include at least one of a dummy common electrode, an ultraviolet ray (UV) blocking layer, and a buffer layer.

The oxidation reducing layer may include the dummy common electrode and the ultraviolet ray (UV) blocking layer. The dummy common electrode may be on the cover layer and the ultraviolet ray (UV) blocking layer may be on the dummy common electrode.

The oxidation reducing layer may include the dummy common electrode and the buffer layer. The dummy common electrode may be on the cover layer and the buffer layer may be on the dummy common electrode.

DETAILED DESCRIPTION

Figure 1:
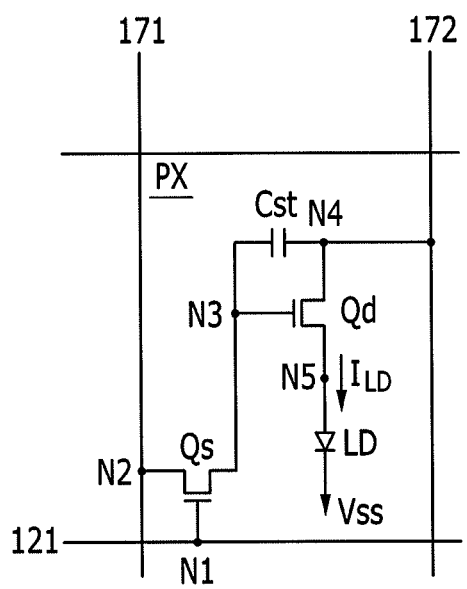
FIG. 1 is an equivalent circuit of one pixel of an organic light emitting diode display according to a first exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

The drawings and description are to be regarded as illustrative in nature and not restrictive. Like reference numerals designate like elements throughout the specification.

Further, the size and thickness of each component shown in the drawings are arbitrarily shown for understanding and ease of description, but embodiments are not limited thereto.

In the drawings, the thickness of layers, films, panels, regions, etc., are exaggerated for clarity. In the drawings, for understanding and ease of description, the thickness of some layers and areas is exaggerated. It will be understood that when an element such as a layer, film, region, or substrate is referred to as being "on" another element, it can be directly on the other element or intervening elements may also be present.

Further, unless explicitly described to the contrary, the word "comprise" and variations such as "comprises" or "comprising", will be understood to imply the inclusion of stated elements but not the exclusion of any other elements. In addition, in the specification, the word "on" means positioning on or below the object portion, but does not essentially mean positioning on the upper side of the object portion based on a gravity direction.

FIG. 1 is an equivalent circuit of one pixel of an organic light emitting diode display according to a first exemplary embodiment. As shown in FIG. 1, the organic light emitting diode display according to the exemplary embodiment includes a plurality of signal lines 121, 171, and 172, and pixels PX connected thereto.

The signal lines include a scan signal line 121 transferring a gate signal (or a scan signal), a data line 171 transferring a data signal, a driving voltage line 172 transferring a driving voltage, and the like. The scan signal lines 121 extend in an approximate row direction and are parallel to each other, and the data lines 171 extend in an approximate column direction and are almost parallel to each other. The driving voltage line 172 extending in an approximate column direction is shown, but the driving voltage line 172 may extend in a row direction or a column direction or may be formed to have a mesh form.

One pixel PX may include a switching transistor Qs, a driving transistor Qd, a storage capacitor Cst, and an organic light emitting element LD.

The switching transistor Qs has a control terminal N1, an input terminal N2, and an output terminal N3, the control terminal N1 is connected to the scan signal line 121, the input terminal N2 is connected to the data line 171, and the output terminal N3 is connected to the driving transistor Qd. The switching transistor Qs responses the scan signal received from the scan signal line 121 to transfer the data signal received from the data line 171 to the driving transistor Qd.

The driving transistor Qd has a control terminal N3, an input terminal N4, and an output terminal N5, the control terminal N3 is connected to the switching transistor Qs, the input terminal N4 is connected to the driving voltage line 172, and the output terminal N5 is connected to the organic light emitting element LD. The driving transistor Qd allows the output current $I_{LD}$ having the magnitude varying according to the voltage applied between the control terminal N3 and output terminal N5 to flow therethrough.

The capacitor Cst is connected between the control terminal N3 and the input terminal N4 of the driving transistor Qd. This capacitor Cst charges the data signal applied to the control terminal N3 of the driving transistor Qd and maintains the data signal even after the switching transistor Qs is turned off.

The organic light emitting element LD is, for example, an organic light emitting diode (OLED), and has an anode connected to the output terminal N5 of the driving transistor Qd and a cathode connected to a common voltage Vss. The organic light emitting element LD displays an image by emitting light while the intensity thereof is changed according to the output current ILD of the driving transistor Qd. The organic light emitting element LD may include an organic material intrinsically emitting any one or at least one light of primary colors such as three primary colors of red, green, and blue, and the organic light emitting diode display displays a desired image by a spatial sum of the colors.

The switching transistor Qs and the driving transistor Qd are an n-channel field effect transistor (FET), but at least one of the transistors may be a p-channel field effect transistor. Further, the connection relation of the transistors Qs and Qd, the capacitor Cst, and the organic light emitting element LD may be changed.

Then, the structure of the organic light emitting diode display according to the first exemplary embodiment will be described in detail with reference to FIG. 2 together with FIG. 1.

Figure 2:
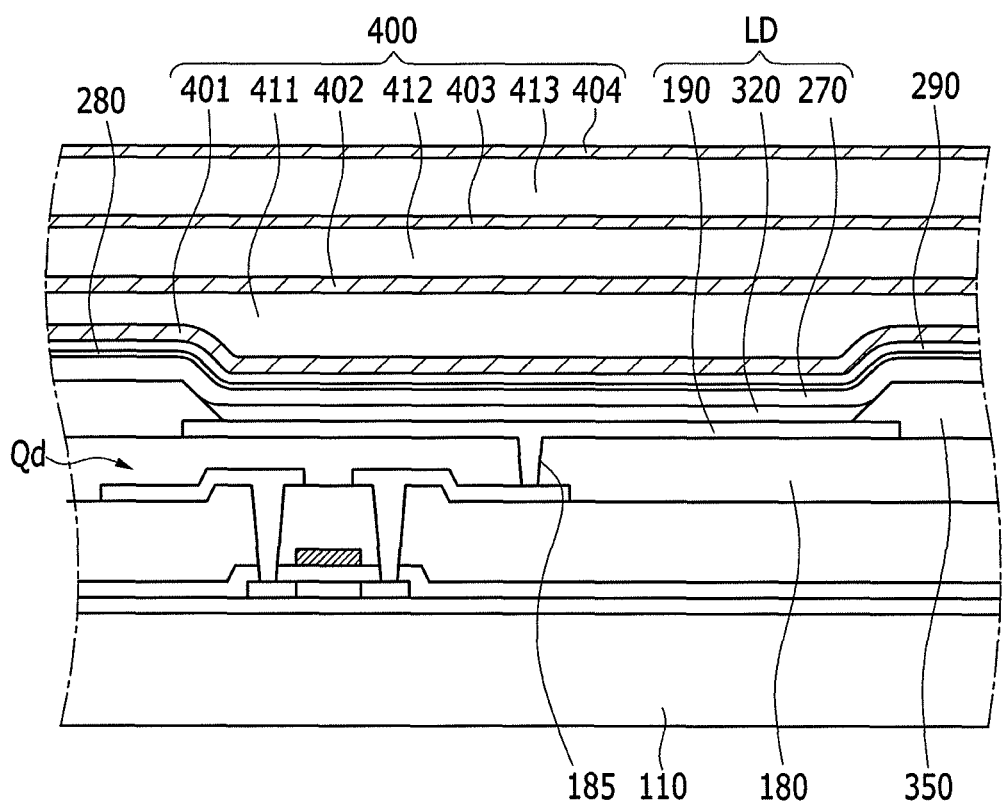
FIG. 2 is a cross-sectional view of the organic light emitting diode display according to the first exemplary embodiment.

FIG. 2 is a cross-sectional view of the organic light emitting diode display according to the first exemplary embodiment.

As shown in FIG. 2, the driving transistor Qd is formed on an insulating substrate 110 that may be made of, e.g., transparent glass or plastics. In addition to this, a plurality of signal lines (not shown), a plurality of switching transistors (not shown), and the like may be further formed on the insulating substrate 110.

A protective layer 180 that may be made of an inorganic or organic material is formed on the driving transistor Qd. In the case where the protective layer 180 is made of the organic material, a surface thereof may be flat. A contact hole 185 through which a portion of the driving transistor Qd is exposed is formed in the protective layer 180. A pixel electrode 190 is formed on the protective layer 180. The pixel electrode 190 may include a reflective electrode and a transparent electrode formed thereon. The reflective electrode may be made of metal having high reflectance, such as silver (Ag) or aluminum (Al), an alloy thereof, or the like, and the transparent electrode may be made of transparent conductive oxides such as ITO (indium tin oxide) or IZO (indium zinc oxide).

A pixel definition layer 350 covering a circumference of an edge of the pixel electrode 190 is formed on the protective layer 180.

An organic emission layer 320 is formed on the pixel electrode 190 and the common electrode 270 is formed on the organic emission layer 320 and the pixel definition layer 350, thereby forming the light emitting diode LD. The common electrode 270 may be formed of an alloy of magnesium (Mg) and silver (Ag) in a thickness of 150 Å or less. When the thickness of the common electrode 270 is larger than 150 Å, transmittance may be deteriorated.

The organic emission layer 320 may further include organic layers (not shown) for efficiently transferring carriers of holes or electrons to the emission layer in addition to an emission layer (not shown) emitting light in practice. The organic layers may be a hole injection layer (HIL) and a hole transport layer (HTL) positioned between the pixel electrode 190 and the emission layer, and an electron injection layer (EIL) and an electron transport layer (ETL) positioned between the common electrode 270 and the emission layer.

A cover layer 280 covering the common electrode 270 to protect the common electrode 270 may be formed of the organic layer on the common electrode 270. A dummy common electrode 290 is formed on the cover layer 280. The dummy common electrode 290 is not connected to the common electrode 270, and separated therefrom.

A thin film encapsulation layer 400 is formed on the dummy common electrode 290. The thin film encapsulation layer 400 seals and protects the organic light emitting element LD and a driving circuit portion formed on the substrate 110 from the outside.

The thin film encapsulation layer 400 includes encapsulation inorganic layers 401, 402, 403, and 404, and encapsulation organic layers 411, 412, and 413 alternately laminated one by one. FIG. 2 shows the case where four encapsulation inorganic layers 401, 402, 403, and 404, and three encapsulation organic layers 411, 412, and 413 are alternately laminated one by one to constitute the thin film encapsulation layer 400 as an example, but embodiments are not limited thereto.

As described above, since the dummy common electrode 290 is first oxidized by diffusion of byproducts, e.g., oxygen ($O_2$) or water ($H_2O$) generated when the thin film encapsulation layer 400 is formed, by forming the dummy common electrode 290 between the common electrode 270 and the thin film encapsulation layer 400, the byproducts are not transferred to the common electrode 270. Therefore, since the common electrode 270 is not oxidized, the common electrode functions properly as the electrode.

In contrast, conventionally when using thin film encapsulation (TFE) technology to encapsulate an organic light emitting element, a sputtering process used to form the thin film encapsulation layer may generate byproducts such as oxygen ($O_2$) or water ($H_2O$), which in turn, may be diffused to a cathode therebeneath to oxidize the cathode, thus generating progressive dark spot defects. However, according to the exemplary embodiments, since a dummy common electrode bonds byproducts generated when a thin film encapsulation layer is formed, e.g., is oxidized, by providing a separate dummy common electrode between a common electrode and a thin film encapsulation layer, the effects of the byproducts on the common electrode can be minimized. Therefore, oxidation of the common electrode by the byproducts occurring when the thin film encapsulation layer is formed can be reduced or prevented.

The dummy common electrode 290 may have a thickness of 50 Å to 200 Å. When the thickness of the dummy common electrode 290 is less than 50 Å, it is difficult to prevent diffusion of the byproducts generated during formation of the thin film encapsulation layer 400 into the common electrode 270. When the thickness of the dummy common electrode 290 is more than 200 Å, transmittance may be reduced.

The dummy common electrode 290 may include any material that produces transparent oxides, e.g., one selected from magnesium (Mg), silver (Ag), lithium (Li), sodium (Na), calcium (Ca), or strontium (Sr), or an alloy thereof, so that transparent oxides are formed during oxidation by the byproducts.

In the first exemplary embodiment, only the dummy common electrode 290 is formed between the common electrode 270 and the thin film encapsulation layer 400. In a second exemplary embodiment, discussed below, an ultraviolet ray (UV) blocking layer blocking ultraviolet rays (UV) and/or a buffer layer having strong tolerance to collision of high energy particles are further formed between the thin film encapsulation layer 400 and the dummy common electrode 290.

Figure 3:
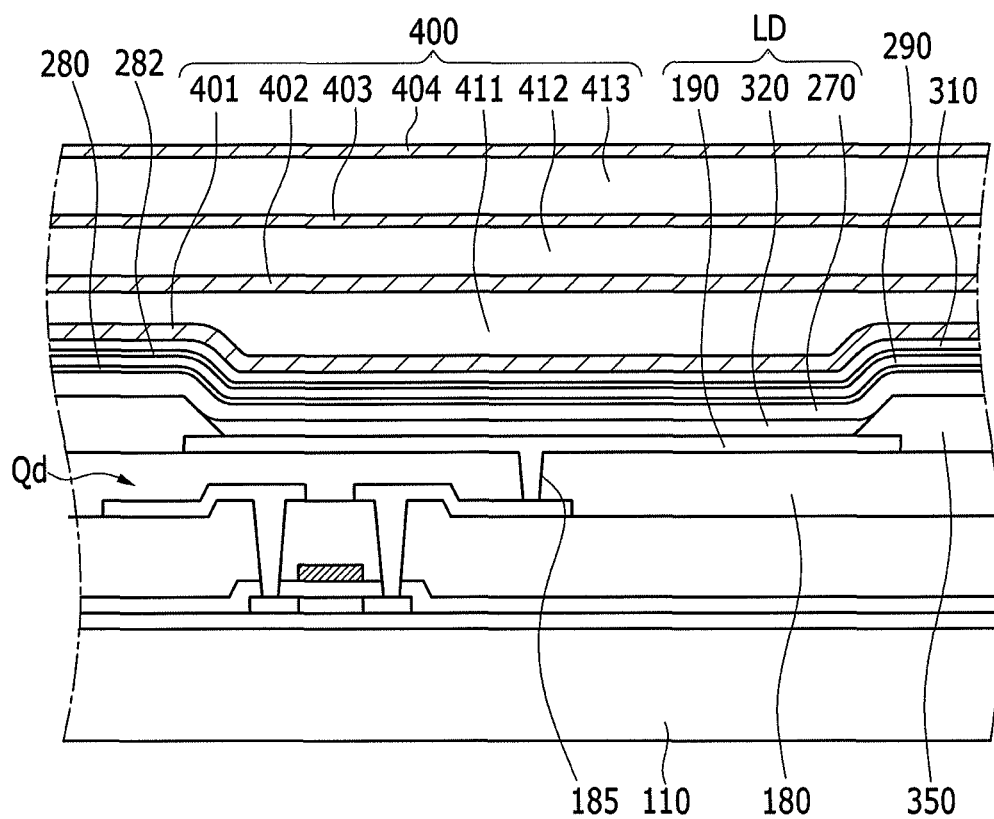
FIG. 3 is a cross-sectional view of an organic light emitting diode display according to a second exemplary embodiment.

FIG. 3 is a cross-sectional view of an organic light emitting diode display according to the second exemplary embodiment. The second exemplary embodiment shown in FIG. 3 is substantially the same as the first exemplary embodiment shown in FIG. 2 with the additional inclusion of an ion tolerance or buffer layer 310 and an ultraviolet ray (UV) blocking layer 282. Thus, a detailed description thereof will not be repeated. As shown in FIG. 3, the ultraviolet ray (UV) blocking layer 282 and the buffer layer 310 are sequentially laminated between the dummy common electrode 290 and the thin film encapsulation layer 400.

The ultraviolet ray (UV) blocking layer 282 may be formed of the same material as the cover layer 280. The ultraviolet ray (UV) blocking layer 282 prevents or reduces byproducts, e.g., oxygen ($O_2$) or water ($H_2O$), generated by plasma used during formation of the encapsulation inorganic layer from directly affecting, e.g., oxidizing, the dummy common electrode 290.

The buffer layer 310 may be a material having a strong tolerance to ion collision, e.g., any one selected from inorganic fluorides, such as lithium fluoride (LiF) and calcium fluoride ($CaF_2$), and inorganic oxides, such as silicon oxide (SiO), titanium oxide (TiOx), molybdenum oxide (MoOx), zinc oxide (ZnO), zinc tin oxide (ZnSnOx), and aluminum oxynitride (AlOxNy). The buffer layer 310 may be formed by a thermal deposition process, and serves to prevent the high energy particles generated by the plasma when the inorganic encapsulation layer is formed from impacting the common electrode 270 therebeneath.

In the exemplary embodiment, both the ultraviolet ray (UV) blocking layer 282 and the buffer layer 310 are shown, but only one of the ultraviolet ray (UV) blocking layer 282 and the buffer layer 310 may be provided. Further, oxidation of the common electrode 270 may be more completely prevented by forming a plurality of oxidation reducing layers, e.g., the dummy common electrode 290 and the ultraviolet ray (UV) blocking layer 282.

According to embodiments, oxidation of the common electrode can be further, e.g., completely, suppressed and physical damage of the common electrode by plasma having high energy can be reduced or prevented by further forming a ultraviolet ray (UV) blocking layer and/or a buffer layer between the dummy common electrode and the thin film encapsulation layer.

By way of summation and review, by providing one or more oxidation reducing layers between the common electrode and the thin film encapsulation layer, and separate from the common electrode, damage to the common electrode that may occur during formation of the thin film encapsulation layer may be reduced or prevented.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode display, comprising:
   a substrate;
   a pixel electrode on the substrate;
   an organic emission layer on the pixel electrode;
   a common electrode on the organic emission layer;
   a cover layer on the common electrode;
   a dummy common electrode on the cover layer; and
   a thin film encapsulation layer covering the dummy common electrode,
   wherein the dummy common electrode is separated from the common electrode, and the dummy common electrode includes a material that is configured to react with oxygen to form a transparent oxide.

2. The organic light emitting diode display of claim 1, wherein the dummy common electrode has a thickness of 50 Å to 200 Å.

3. The organic light emitting diode display of claim 1, wherein the dummy common electrode includes at least one of magnesium (Mg), silver (Ag), lithium (Li), sodium (Na), calcium (Ca), or strontium (Sr), or an alloy thereof.

4. The organic light emitting diode display of claim 1, further comprising an ultraviolet ray (UV) blocking layer between the dummy common electrode and the thin film encapsulation layer.

5. The organic light emitting diode display of claim 4, further comprising a buffer layer between the ultraviolet ray (UV) blocking layer and the thin film encapsulation layer.

6. The organic light emitting diode display of claim 5, wherein the buffer layer includes at least one of lithium fluoride (LiF), calcium fluoride ($CaF_2$), silicon oxide (SiO), titanium oxide (TiOx), molybdenum oxide (MoOx), zinc oxide (ZnO), zinc tin oxide (ZnSnOx), and aluminum oxynitride (AlOxNy).

7. The organic light emitting diode display of claim 5, wherein at least one of the dummy common electrode and the ultraviolet ray (UV) blocking layer is configured to reduce oxidation of the common electrode.

8. The organic light emitting diode display of claim 1, wherein the thin film encapsulation layer includes at least one encapsulation organic layer and at least one encapsulation inorganic layer alternately laminated.

9. An organic light emitting diode display, comprising:
a substrate;
a pixel electrode on the substrate;
an organic emission layer on the pixel electrode;
a common electrode on the organic emission layer;
a cover layer on the common electrode;
an oxidation reducing layer on the cover layer, the oxidation reducing layer being configured to reduce oxidation of the common electrode; and
a thin film encapsulation layer covering the oxidation reducing layer,
wherein the oxidation reducing layer is separated from the common electrode, the oxidation reducing layer includes a dummy common electrode and an ultraviolet ray (UV) blocking layer.

10. The organic light emitting diode display of claim 9, wherein the dummy common electrode is on the cover layer and the ultraviolet ray (UV) blocking layer is on the dummy common electrode.

11. The organic light emitting diode display of claim 9, wherein the oxidation reducing layer includes a buffer layer.

12. The organic light emitting diode display of claim 11, wherein the dummy common electrode is on the cover layer and the buffer layer is on the dummy common electrode.

13. An organic light emitting diode display, comprising:
a substrate;
a pixel electrode on the substrate;
an organic emission layer on the pixel electrode;
a common electrode on the organic emission layer;
a cover layer on the common electrode;
a dummy common electrode on the cover layer;
a thin film encapsulation layer covering the dummy common electrode; and
an ultraviolet ray (UV) blocking layer between the dummy common electrode and the thin film encapsulation layer, wherein the dummy common electrode is separated from the common electrode.

14. The organic light emitting diode display of claim 13, further comprising a buffer layer between the ultraviolet ray (UV) blocking layer and the thin film encapsulation layer.

15. The organic light emitting diode display of claim 14, wherein the buffer layer includes at least one of lithium fluoride (LiF), calcium fluoride ($CaF_2$), silicon oxide (SiO), titanium oxide (TiOx), molybdenum oxide (MoOx), zinc oxide (ZnO), zinc tin oxide (ZnSnOx), and aluminum oxynitride (AlOxNy).

16. The organic light emitting diode display of claim 14, wherein at least one of the dummy common electrode and the ultraviolet ray (UV) blocking layer is configured to reduce oxidation of the common electrode.

17. The organic light emitting diode display of claim 13, wherein the dummy common electrode includes at least one of magnesium (Mg), silver (Ag), lithium (Li), sodium (Na), calcium (Ca), or strontium (Sr), or an alloy thereof.

18. The organic light emitting diode display of claim 13, wherein the thin film encapsulation layer includes at least one encapsulation organic layer and at least one encapsulation inorganic layer alternately laminated.

19. An organic light emitting diode display, comprising:
a substrate;
a pixel electrode on the substrate;
an organic emission layer on the pixel electrode;
a common electrode on the organic emission layer;
a cover layer on the common electrode;
an oxidation reducing layer on the cover layer, the oxidation reducing layer being configured to reduce oxidation of the common electrode; and
a thin film encapsulation layer covering the oxidation reducing layer,
wherein the oxidation reducing layer is separated from the common electrode, wherein the oxidation reducing layer includes a dummy common electrode and a buffer layer.

20. The organic light emitting diode display of claim 19, wherein the dummy common electrode is on the cover layer and the buffer layer is on the dummy common electrode.

* * * * *